(12) United States Patent
Liu et al.

(10) Patent No.: US 8,248,353 B2
(45) Date of Patent: Aug. 21, 2012

(54) METHOD AND DEVICE FOR REDUCING VOLTAGE STRESS AT BOOTSTRAP POINT IN ELECTRONIC CIRCUITS

(75) Inventors: Sheng-Chao Liu, Hsinchu (TW); Chen-Ming Chen, Hsinchu (TW); Ming-Tien Lin, Hsinchu (TW)

(73) Assignee: AU Optronics Corporation (TW)

( * ) Notice: Subject to any disclaimer, the term of this patent is extended or adjusted under 35 U.S.C. 154(b) by 1389 days.

(21) Appl. No.: 11/894,752

(22) Filed: Aug. 20, 2007

(65) Prior Publication Data

US 2009/0051639 A1    Feb. 26, 2009

(51) Int. Cl.
*G09G 3/36* (2006.01)
(52) U.S. Cl. ...................................................... 345/100
(58) Field of Classification Search ................... 345/100
See application file for complete search history.

(56) References Cited

U.S. PATENT DOCUMENTS

| 6,834,095 | B2* | 12/2004 | Yu | 377/71 |
| 6,885,723 | B2 | 4/2005 | Yu | 377/78 |
| 7,408,386 | B2 | 8/2008 | Yu | 326/83 |
| 2006/0103429 | A1* | 5/2006 | Nonaka | 326/88 |
| 2006/0279512 | A1* | 12/2006 | Kim et al. | 345/100 |
| 2007/0071158 | A1* | 3/2007 | Wei et al. | 377/64 |
| 2008/0232019 | A1* | 9/2008 | Todd | 361/111 |

* cited by examiner

*Primary Examiner* — Quan-Zhen Wang
*Assistant Examiner* — Tony Davis

(57) ABSTRACT

A discharging device is used to reduce the voltage level at a bootstrap point in an electronic circuit such as a shift register circuit. In such a circuit, a first transistor in a conducting state receives an input pulse and conveys it to the gate terminal of a second transistor, causing the second transistor to be in a conducting state. This gate terminal is known as a bootstrap point. After receiving the input pulse, an output pulse is produced at one drain/source terminal of the second transistor. During the time period of the output pulse, the first transistor is in a non-conducting state and the voltage level at the bootstrap point is high, imposing a stress upon the first transistor. A discharging circuit consisting of at least one transistor is coupled to the bootstrap point in order to reduce the voltage level at the output pulse period.

20 Claims, 13 Drawing Sheets

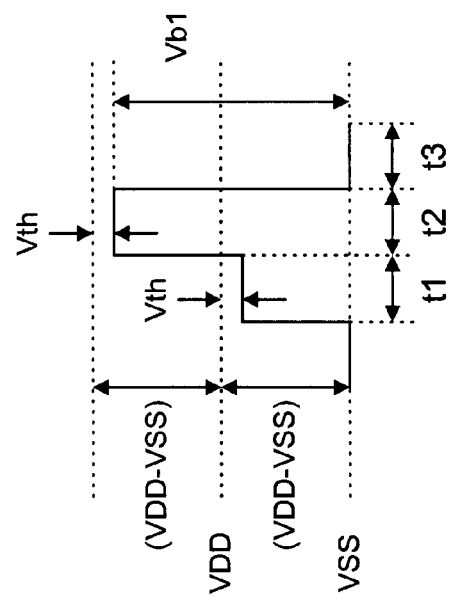
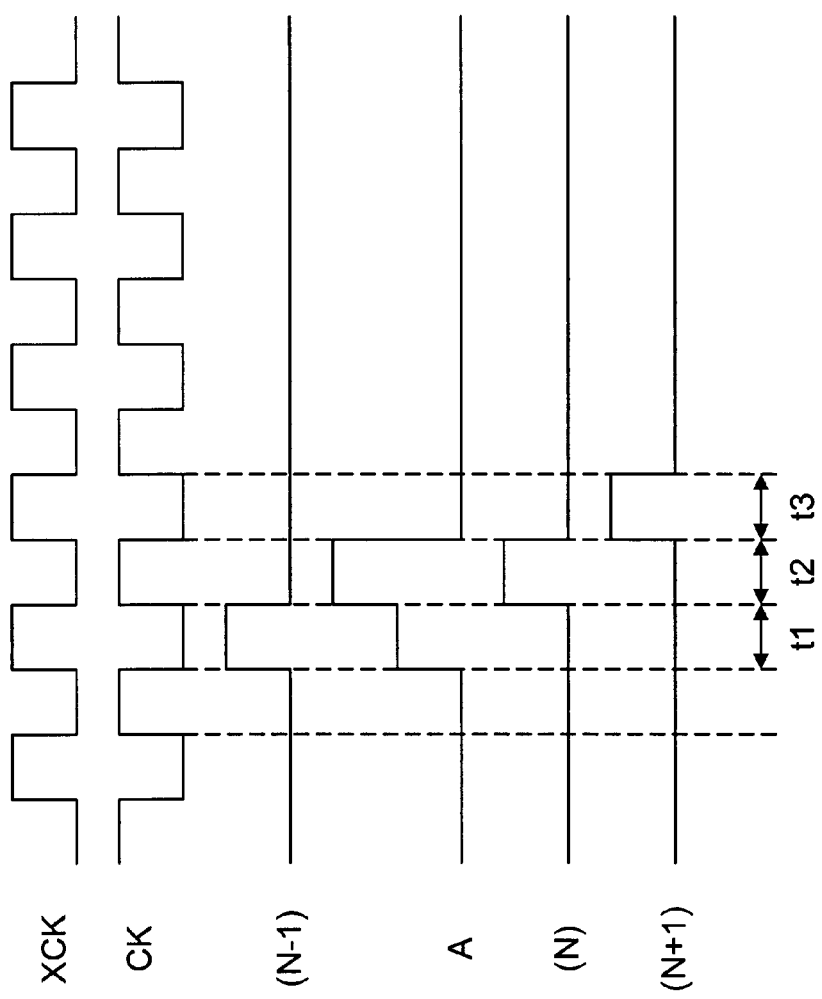
FIG. 3
FIG. 2

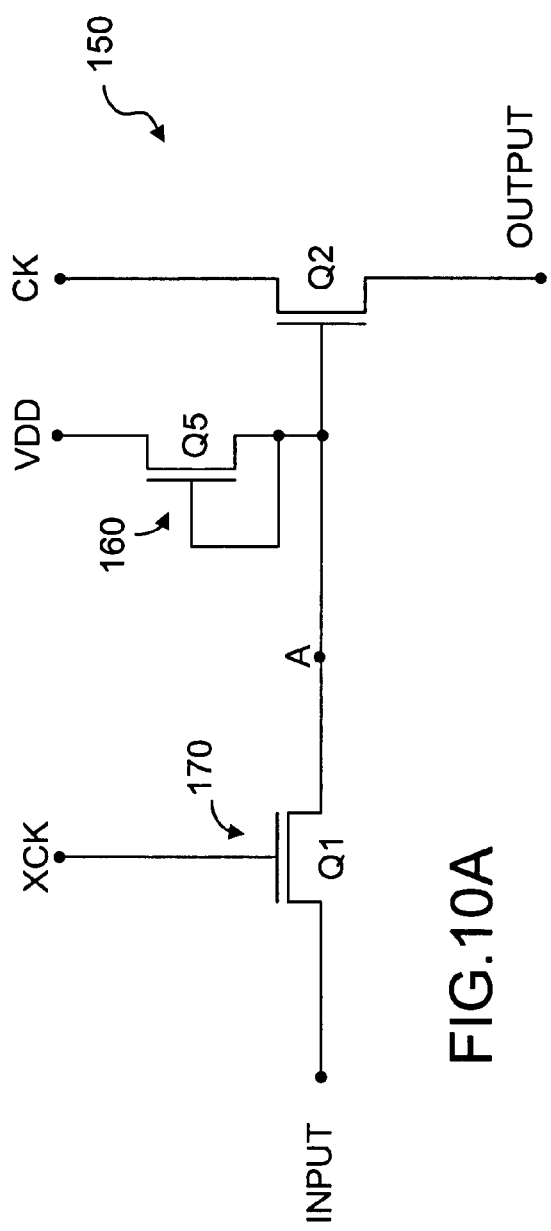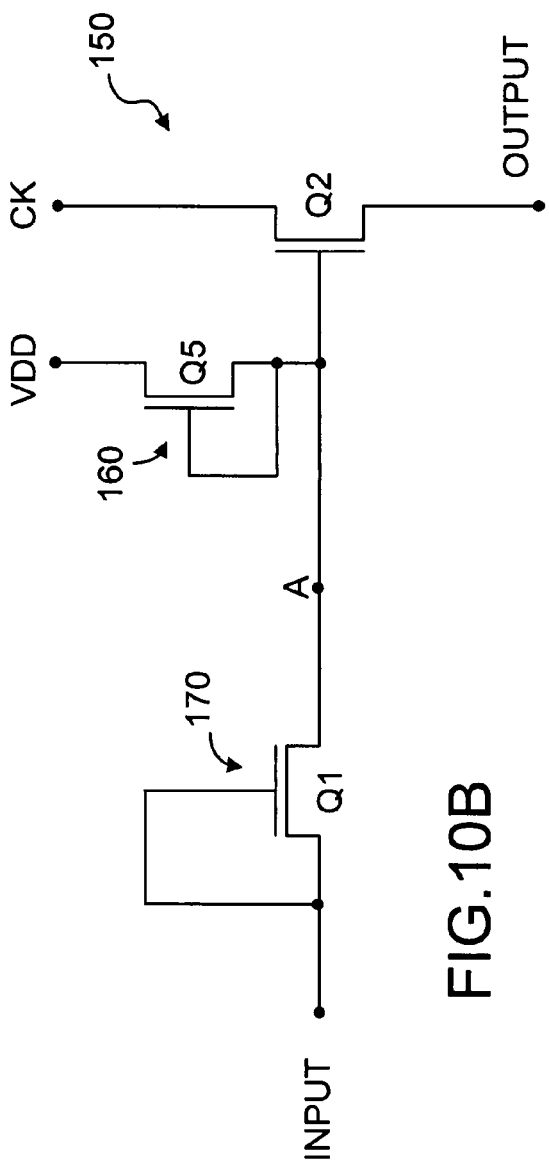
FIG.10A
FIG.10B

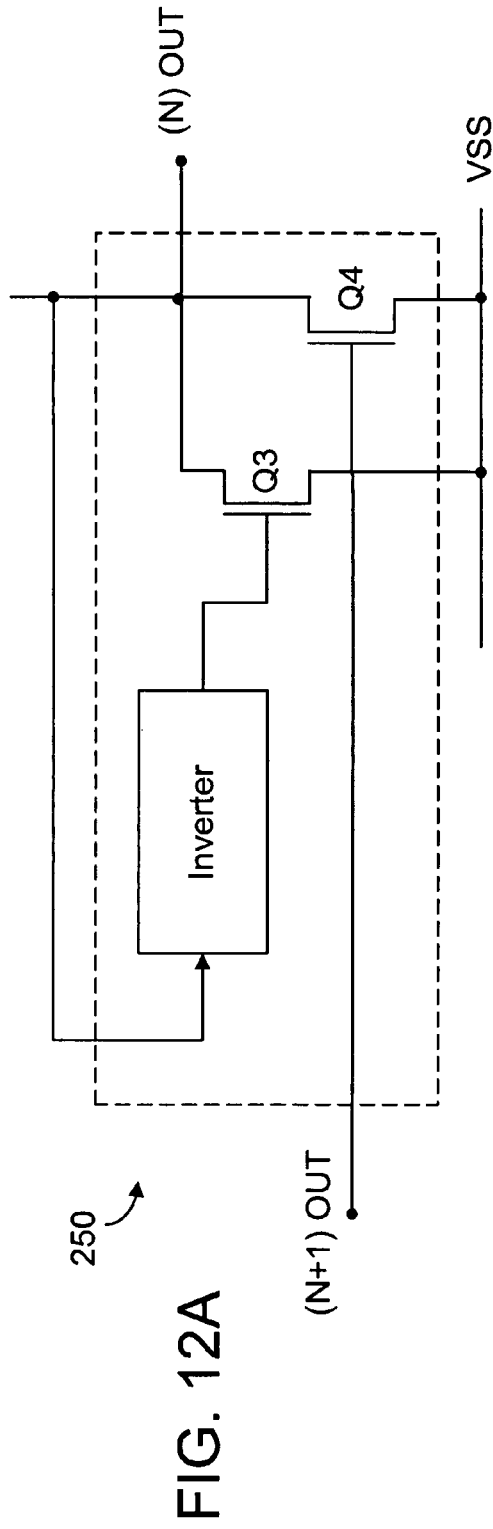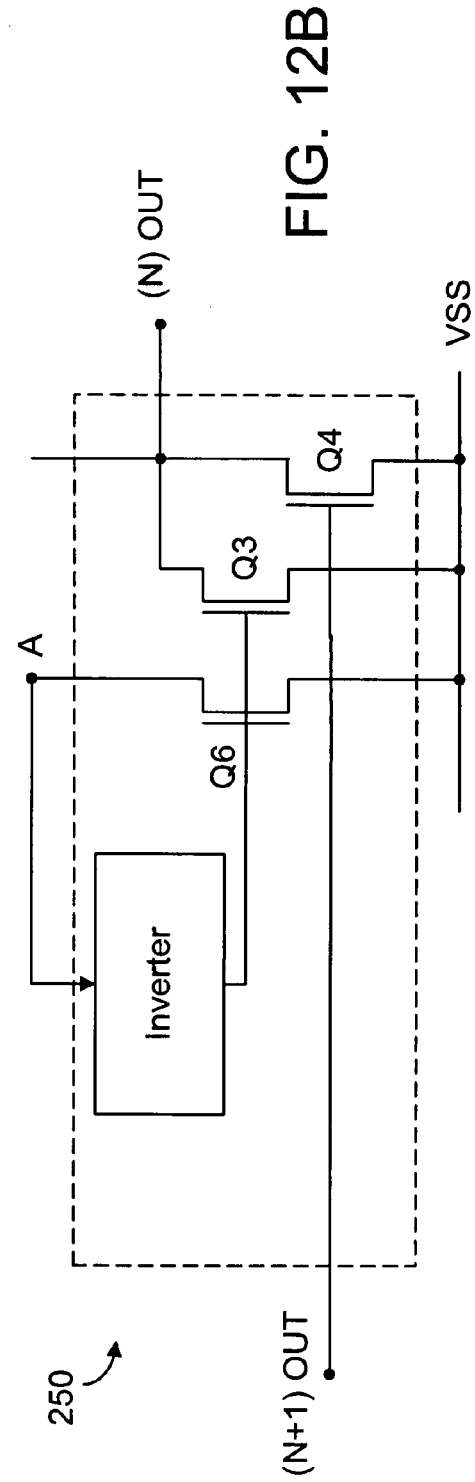
FIG. 12A
FIG. 12B

METHOD AND DEVICE FOR REDUCING VOLTAGE STRESS AT BOOTSTRAP POINT IN ELECTRONIC CIRCUITS

FIELD OF THE INVENTION

The present invention relates to an electronic circuit, such as a shift register circuit and, more particularly, to an electronic circuit having a bootstrap point.

BACKGROUND OF THE INVENTION

Shift registers are commonly used to drive a display panel, such as a thin-film transistor liquid-crystal display (TFT-LCD) panel. In a typical TFT-LCD display panel, a plurality of pixels are arranged in a two-dimensional array. These pixels are controlled by a plurality of data lines and a plurality of gate lines. The data lines are connected to a data source driver and the gate lines are connected to a gate line driver. A gate line driver comprises a shift register module having a plurality of shift register units connected in a cascade manner such that the output of a shift register unit in a stage is connected to the input of a shift register unit of the subsequent stage. The output of each shift register unit in a shift register module is connected to a gate line of the display panel for sequentially driving the pixel array. All the shift register units in a shift register module are connected to a clock signal (CK), a complementary or inverted clock signal (XCK) and a source voltage (VSS).

A prior art shift register (SR) circuit is shown in FIG. 1. As shown in FIG. 1, the SR circuit 2 comprises four transistors Q1-Q4 and an inverter 20. The first transistor Q1 has a gate coupled to the inverted clock signal XCK and a first source/drain coupled to a signal output (N−1) from a previous-stage shift-register unit. The inverter 20 has an input terminal coupled to the first source/drain of the first transistor Q1. The second transistor Q2 has a gate coupled to a second source/drain of the first transistor Q1; a first source/drain coupled to the clock signal CK and a second source/drain coupled to an output terminal N. The third transistor Q3 has a gate coupled to the output terminal of the inverter 20; a first source/drain coupled to the output terminal N and a second source/drain coupled to the source voltage VSS. The fourth transistor Q4 has a gate coupled to a signal output N+1 from a next-stage shift-register unit; a first source/drain coupled to the output terminal N and a second source/drain coupled to the source voltage VSS. In the SR circuit as shown in FIG. 1, the point A between the gate of the second transistor Q2 and the second source/drain of the first transistor Q1 is known as a bootstrap point. The bootstrap point A and the second source/drain of the second transistor Q2 is capacitively coupled as indicated by the capacitor C.

FIG. 2 is a timing chart showing the SR output of the current stage N, the SR output of the previous stage N−1, and the SR output of the next stage N+1 in relation to the clock signal CK, the inverted clock signal XCK along with the voltage level at the bootstrap point A.

The operation of the SR circuit is as follows. When the inverted clock signal XCK is at a high voltage level, the first transistor Q1 is turned on. The previous-stage shift-register unit (N−1) outputs a high voltage level signal through the first transistor Q1 to turn on the second transistor Q2. As a result, the output terminal (N) outputs a clock signal to the next-stage shift-register unit (N+1). In addition, the fourth transistor Q4 is switched on by the output signal of the next-stage shift-register unit (N+1). When the fourth transistor Q4 is turned on, the output terminal (N) outputs a low voltage level signal.

When the output terminal (N−1) of the previous-stage shift-register unit outputs a low voltage level signal to the inverter 20, the inverter 20 outputs a high voltage level signal to the third transistor Q3. Thus, the output terminal (N) is held at a low voltage level.

When the first transistor Q1 is turned on during the time period t1, the voltage level of the bootstrap point A and the output signal N are almost equal with a difference of the transistor threshold voltage Vth (see FIG. 3). When the inverted clock signal XCK is at a low voltage level, the bootstrap point A is in a floating state. According to the feedthough voltage drop theory, the voltage difference between the gate and the first source/drain of the second transistor Q2 is held steady. When the clock signal Ck is at a high voltage level during the time period t2, the bootstrap point A is at a higher voltage level Vb1 (see FIG. 3). During the time period t3, the output of the next stage shift-register unit (N+1) is high, and the voltage at the bootstrap point A is discharged to a low level.

As shown in FIG. 3, the voltage level at the bootstrap point A is equal to Vb1 during the time period t2, and Vb1 is given by $$Vb1 = 2 \times (VDD - VSS) - Vth$$

where VDD is the drain voltage which is substantially equal the voltage level of CK when CK is at a high level, and VDD is higher than VSS. Because the voltage level Vb1 during the time period t2 is relatively high as compared to the voltage level at (N−1)OUT, the source-drain voltage imposes a high stress on the first transistor Q1. This stress could damage the first transistor Q1 and cause the voltage drift in the SR unit.

Likewise, in an electronic circuit that uses a first transistor as a switch to provide a bias voltage level to the gate of a second transistor at a clock cycle and to maintain the charge at that gate at a complementary clock cycle, the voltage level at the gate, or the bootstrap point, gives rise to a relative high source-drain voltage of the first transistor at the complementary clock cycle. This source-drain voltage imposes a high stress on the first transistor.

It is advantageous and desirable to provide a method and device to reduce the voltage level at the bootstrap point and thus the source-drain voltage of the first transistor in such an electronic circuit.

SUMMARY OF THE INVENTION

In a shift register module having a plurality of shift register units arranged in a cascade fashion, the shift register unit at a current stage receives an output pulse from the shift register unit at the previous stage to produce an output pulse of the current stage. Typically, a first transistor is coupled to the output of the previous stage shift register unit and used as a switch to receive the output pulse from the previous stage. At the arrival of the previous stage output pulse, the transistor is operated in a conducting state. The previous stage output pulse is conveyed to a gate terminal of a second transistor in the current shift register unit for causing the second transistor to be in a conducting state. After receiving that output pulse, the first transistor is operated in a non-conducting state and an output pulse is produced in the current stage shift register unit. While the current stage shift register unit outputs an output pulse, the voltage differential across the first transistor is unnecessarily high, imposing a stress on the first transistor. The present invention provides a method and a circuit element for reducing the stress on the first transistor in the period when the current stage shift register unit outputs its output pulse. In particular, the present invention uses a discharging circuit coupled to the gate terminal of the second transistor to reduce the voltage differential across the first transistor.

Thus, the first aspect of the present invention is a method for use in a circuit section of an electronic circuit. The method comprises:

coupling a discharging element to the circuit section at a coupling point in the circuit section, wherein the circuit section is operable in a first time period and a second time period following the first time period, and the coupling point has a first voltage level in the first time period and a second voltage level in the second time period; and reducing the second voltage level at the coupling point in the second time period through the discharging element, wherein the circuit section comprises:

an input element operable in a connecting state and a non-connecting state, and an output element having an output terminal and a gate coupled to the input element at the coupling point in the circuit section, wherein when the circuit section is operated in the first time period, the input element is operated in the connecting state for providing a bias voltage level to the gate of the output element through the coupling point, wherein the bias voltage level is substantially equal to the first voltage level, and when the circuit section is operated in the second time period, the input element is operated in the non-connecting state, the voltage level at the coupling point increases from the first voltage level to the second voltage level partly due to an increased voltage level at the output terminal of the output element.

According to one embodiment of the present invention, the input element comprises a first transistor. When the input element is operated in the connecting state, the first transistor is operated in a conducting state, and when the input element is operated in the non-connecting state, the first transistor is operated in a non-conducting state, and wherein the output element comprises a second transistor having a source/drain terminal coupling to the output terminal.

According to one embodiment of the present invention, the discharging element comprises a third transistor having a first source/drain terminal coupled to the coupling point;
a gate terminal coupled to the coupling point and
a second source/drain terminal coupling a reference voltage level substantially equal to the first voltage level so as to maintain the first voltage level in the first time period and to reduce the second voltage level in the second time period.

According to one embodiment of the present invention, the first transistor comprises:

a first drain/source terminal coupled to the coupling point;
a second drain/source terminal coupled to an input to receive an input voltage substantially equal to the first voltage level in the first time period; and
a gate coupling to a clock signal for causing the first transistor to operate in the conducting state in the first time period.

According to another embodiment of the present invention, the first transistor comprises:

a first drain/source terminal coupled to the coupling point;
a second drain/source terminal and a gate both coupled to an input to receive an input voltage substantially equal to the first voltage level in the first time period.

According to a different embodiment of the present invention, the first transistor comprises:

a first drain/source terminal coupled to the coupling point;
a second drain/source terminal coupled to a clock signal substantially equal to the first voltage level in the first time period and
a gate coupled to an input to receive an input voltage for causing the first transistor to operate in the conducting state in the first time period.

The second aspect of the present invention is an electronic circuit, which comprises:

an input element operable in a connecting state and in a non-connecting state;

an output element having an output terminal, and a gate coupled to the input element at a coupling point; and a discharging element coupled to the coupling point, wherein the electronic circuit is operable in a first time period and a second time period following the first time period, and wherein, in the first time period, the input element is operated in the connecting state for providing a first voltage level to the gate of the output element through the coupling point, and in the second time period, the input element is operated in the non-connecting state, and a voltage level at the coupling point increases from the first voltage level to a second voltage level partly due to an increased voltage level at the output terminal of the output element, and wherein the discharging element is adapted to reduce the second voltage level at the coupling point in the second time period.

According to one embodiment of the present invention, the input element comprises a first transistor. When the input element is operated in the connecting state, the first transistor is operated in a conducting state, and when the input element is operated in the non-connecting state, the first transistor is operated in a non-conducting state, and wherein the output element comprises a second transistor having a source/drain terminal coupling to the output terminal.

According to one embodiment of the present invention, the discharging element comprises a third transistor having a first source/drain terminal coupled to the coupling point;
a gate terminal coupled to the coupling point and
a second source/drain terminal coupling a reference voltage level substantially equal to the first voltage level so as to maintain the first voltage level in the first time period and to reduce the second voltage level in the second time period.

According to one embodiment of the present invention, the first transistor comprises:

a first drain/source terminal coupled to the coupling point;
a second drain/source terminal coupled to an input terminal to receive an input voltage substantially equal to the first voltage level in the first time period; and
a gate coupling to a clock signal for causing the first transistor to operate in the conducting state in the first time period.

According to another embodiment of the present invention, the first transistor comprises:

a first drain/source terminal coupled to the coupling point;
a second drain/source terminal and a gate both coupled to an input to receive an input voltage substantially equal to the first voltage level in the first time period.

According to a different embodiment of the present invention, the first transistor comprises:

a first drain/source terminal coupled to the coupling point;
a second drain/source terminal coupled to a clock signal substantially equal to the first voltage level in the first time period and a gate coupled to an input to receive an input voltage for causing the first transistor to operate in the conducting state in the first time period.

According to one embodiment of the present invention, the second transistor further comprises a second source/drain terminal coupled to a second clock signal complementary to the clock signal.

According to one embodiment of the present invention, the electronic circuit further comprises:

an inverter having an output end;

a third transistor having a gate, a first source/drain and a second source/drain; and a fourth transistor having a gate, a first source/drain and a second source/drain, wherein the discharging element comprises a fifth transistor having a first source/drain terminal coupled to the coupling point;

a gate terminal coupled to the coupling point and a second source/drain terminal coupling a first reference voltage level substantially equal to the first voltage level so as to maintain the first voltage level in the first time period and to reduce the second voltage level in the second time period, and wherein the gate of the third transistor is coupled to the output end of the inverter; the first source/drain of the third transistor is coupled to the output terminal; and the second source/drain of the third transistor is coupled to a second reference voltage level, and the gate of the fourth transistor is coupled to a second input terminal, the first source/drain of the fourth transistor is coupled to the output terminal and the second source/drain of the fourth transistor is coupled to the second reference voltage level.

According to one embodiment of the present invention, the first to fifth transistors are NMOS transistors and the first source/drain of the first transistor is coupled to an input end of the inverter, and the second reference voltage level is lower than the first reference voltage level.

According to another embodiment of the present invention, the first to fifth transistors are PMOS transistors and the first source/drain of the third transistor is coupled to an input end of the inverter, and the second reference voltage level is higher than the first re voltage level.

The third aspect of the present invention is a shift register module, which comprises:

a first clock signal input;

a second clock signal input;

a first voltage input;

a second voltage input;

a start pulse input;

a plurality of other shift register units arranged in a plurality of stages, each of said plurality of register units comprising:

a first input terminal;

a second input terminal;

an output terminal;

an inverter having an output;

a discharging unit having a first end and a second end;

a first transistor having a gate, a first source/drain and a second source/drain;

a second transistor having a gate, a first source/drain and a second source/drain;

a third transistor having a gate, a first source/drain and a second source/drain; and a fourth transistor having a gate, a first source/drain and a second source/drain, wherein the gate of the first transistor is coupled to the first clock signal input; the first drain/source of the first transistor is coupled to the first input terminal, and the second drain/source of the first transistor is coupled to the gate of the second transistor;

the first source/drain of the second transistor is coupled to the second clock signal input, and the second source/drain of the second transistor is coupled to the output terminal;

the gate of the third transistor is coupled to the output of the inverter; the first source/drain of the third transistor is coupled to the output terminal; and the second source/drain of the third transistor is coupled to the first voltage input;

the gate of the fourth transistor is coupled to the second input terminal, the first source/drain of the fourth transistor is coupled to the output terminal, and the second source/drain of the fourth transistor is coupled to the first voltage input; and the first end of the discharging circuit is coupled to a second voltage input, and the second end of the discharging circuit is coupled to the gate of the second transistor; and wherein the shift registers are connected in a cascade manner such that the first input terminal of one shift register unit is coupled to the output terminal of the shift register in a previous stage;

the second input terminal of said one shift register unit is coupled to the output terminal of the shift register in a next stage;

the first input terminal of the shift register in a first stage is coupled to the start pulse input;

the first clock signal input and the second signal input are adapted for receiving complementary clock signals; and the first voltage input and the second voltage input are adapted for receiving, respectively, a first voltage level and a different second voltage level.

According to one embodiment of the present invention, the discharging circuit comprises a transistor having a gate, a first source/drain and second source/drain, wherein the first source/drain is coupled to the first end of the discharging circuit, and the gate and the second source/drain are coupled to the second end of the discharging circuit.

According to one embodiment of the present invention, the first to fourth transistors are NMOS transistors and the first source/drain of the first transistor is coupled to an input of the inverter, and the first voltage level is lower than the second voltage level.

According to another embodiment of the present invention, the first to fourth transistors are PMOS transistors and the first source/drain of the third transistor is coupled to an input of the inverter, and the first voltage level is higher than the second voltage level.

The present invention will become apparent upon reading the description taken in conjunction with FIGS. 4 to 12d.

BRIEF DESCRIPTION OF THE DRAWINGS

FIG. 2 shows a timing chart of the prior art shift register circuit.

FIG. 3 shows the voltage level at the bootstrap point in the prior art shift register circuit.

FIG. 10a shows a bootstrap circuit section for use in a shift register circuit of FIG. 4.

FIG. 10b shows a bootstrap circuit section, according to a different embodiment of the present invention.

FIG. 12a shows a variation in part of an NMOS shift register circuit, according to one embodiment of the present invention.

FIG. 12b shows a variation in part of an NMOS shift register circuit, according to another embodiment of the present invention.

DETAILED DESCRIPTION OF THE INVENTION

Figure 9:
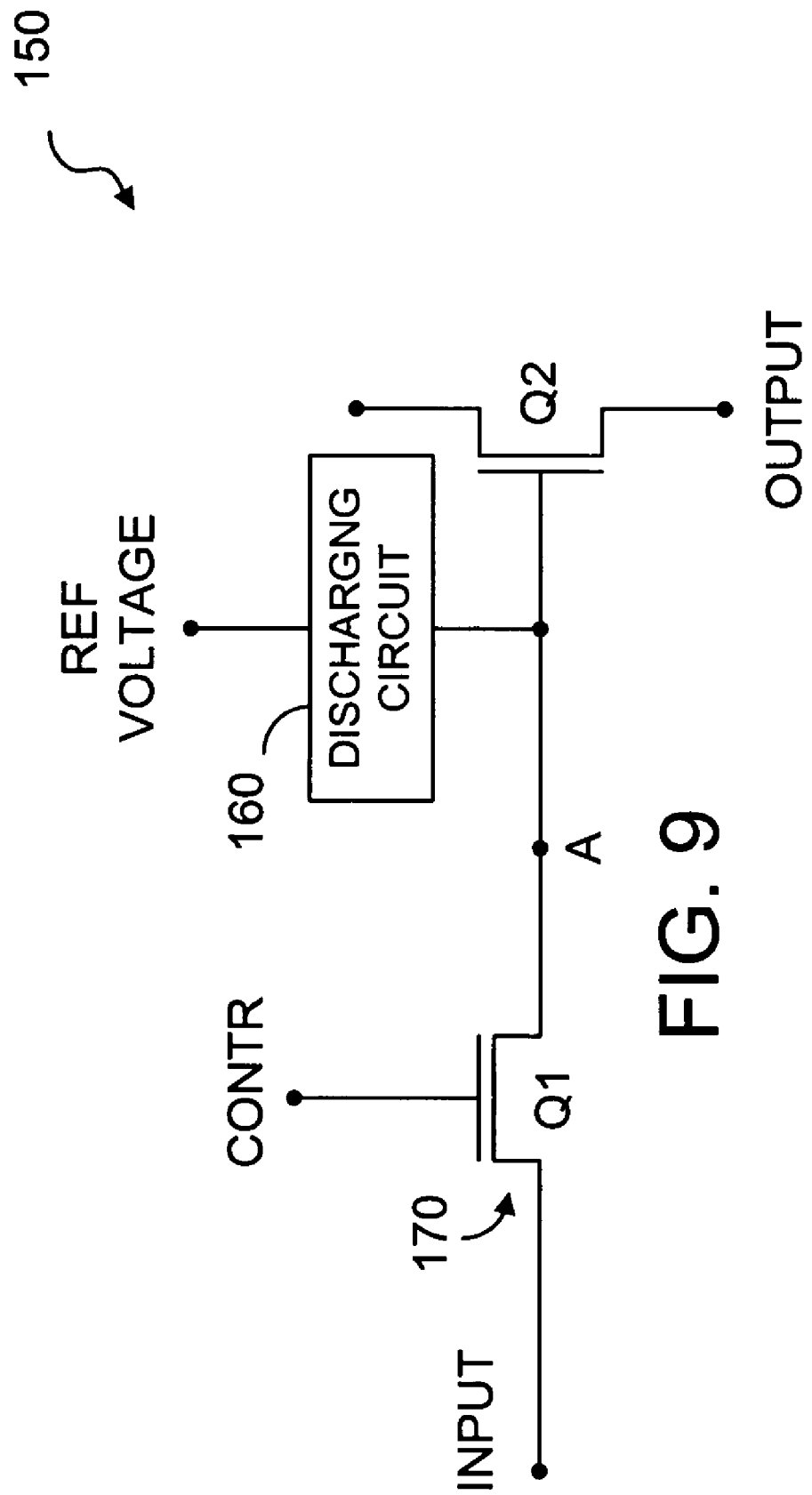
FIG. 9 shows a bootstrap circuit section having a discharging circuit or module to reduce the voltage at the bootstrap point, according to one embodiment of the present invention.

The objective of the present invention is to reduce the voltage level at a bootstrap point, so as to reduce the voltage stress imposed on the transistor or transistors coupled to the bootstrap point. The bootstrap point exists in a circuit where a first transistor is used as a switch to provide a bias voltage level to the gate of a second transistor at a clock cycle and to maintain the charge at that gate at a complementary clock cycle. The bootstrap point is located at the gate of the second transistor. If the voltage level at the bootstrap point gives rise to a relative high source-drain voltage of the first transistor at the complementary clock cycle, this source-drain voltage imposes a high stress on the first transistor. A bootstrap circuit section is shown in FIG. 9.

Figure 4:
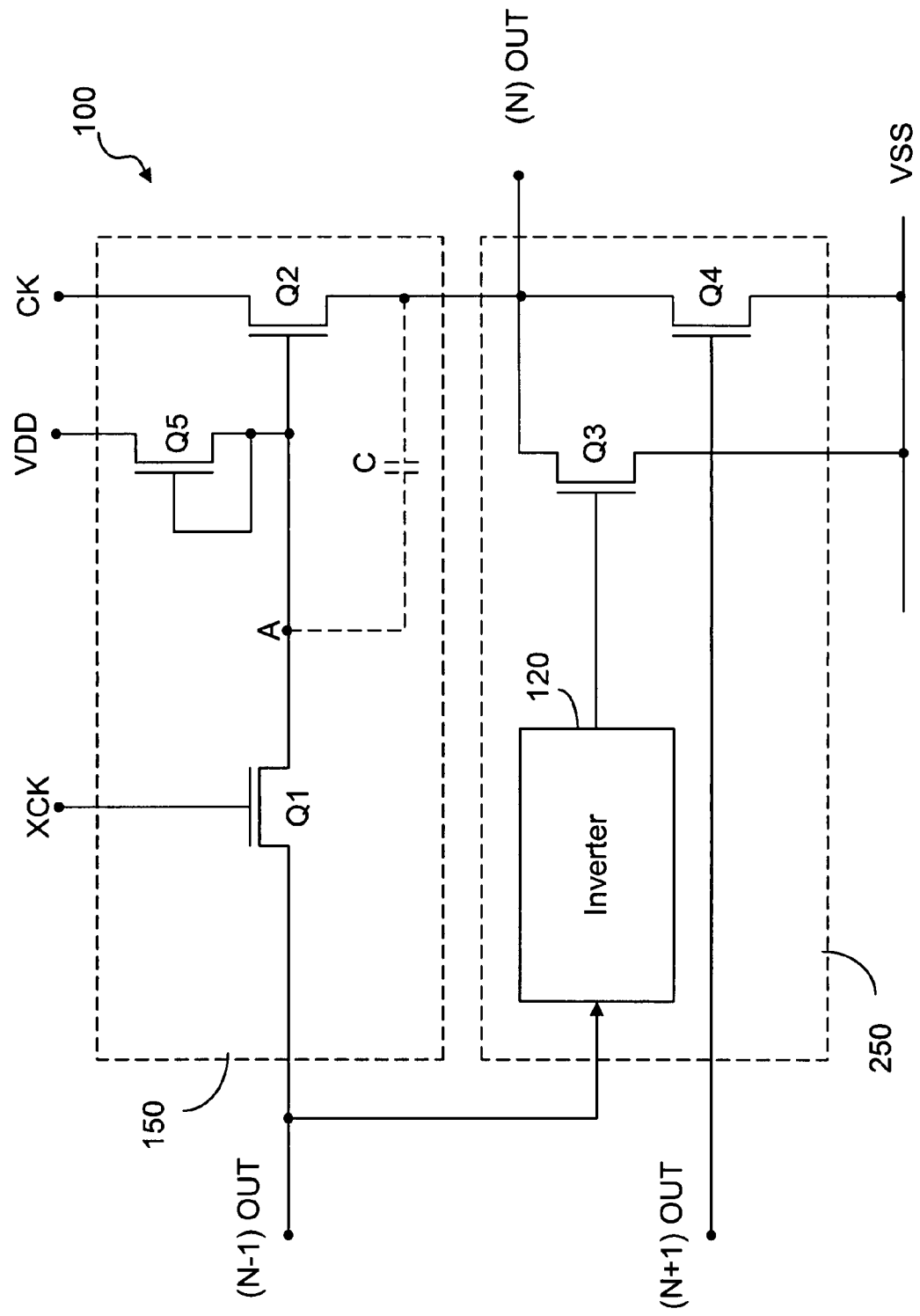
FIG. 4 shows a shift register circuit, according to one embodiment of the present invention.
Figure 6:
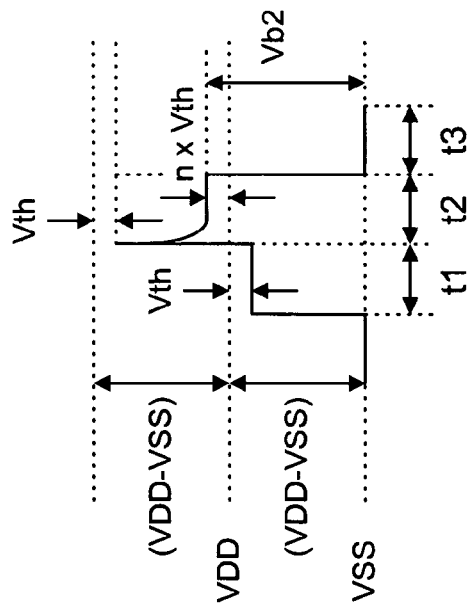
FIG. 6 shows the voltage level at the bootstrap point in the shift register circuit of FIG. 4.
Figure 7:
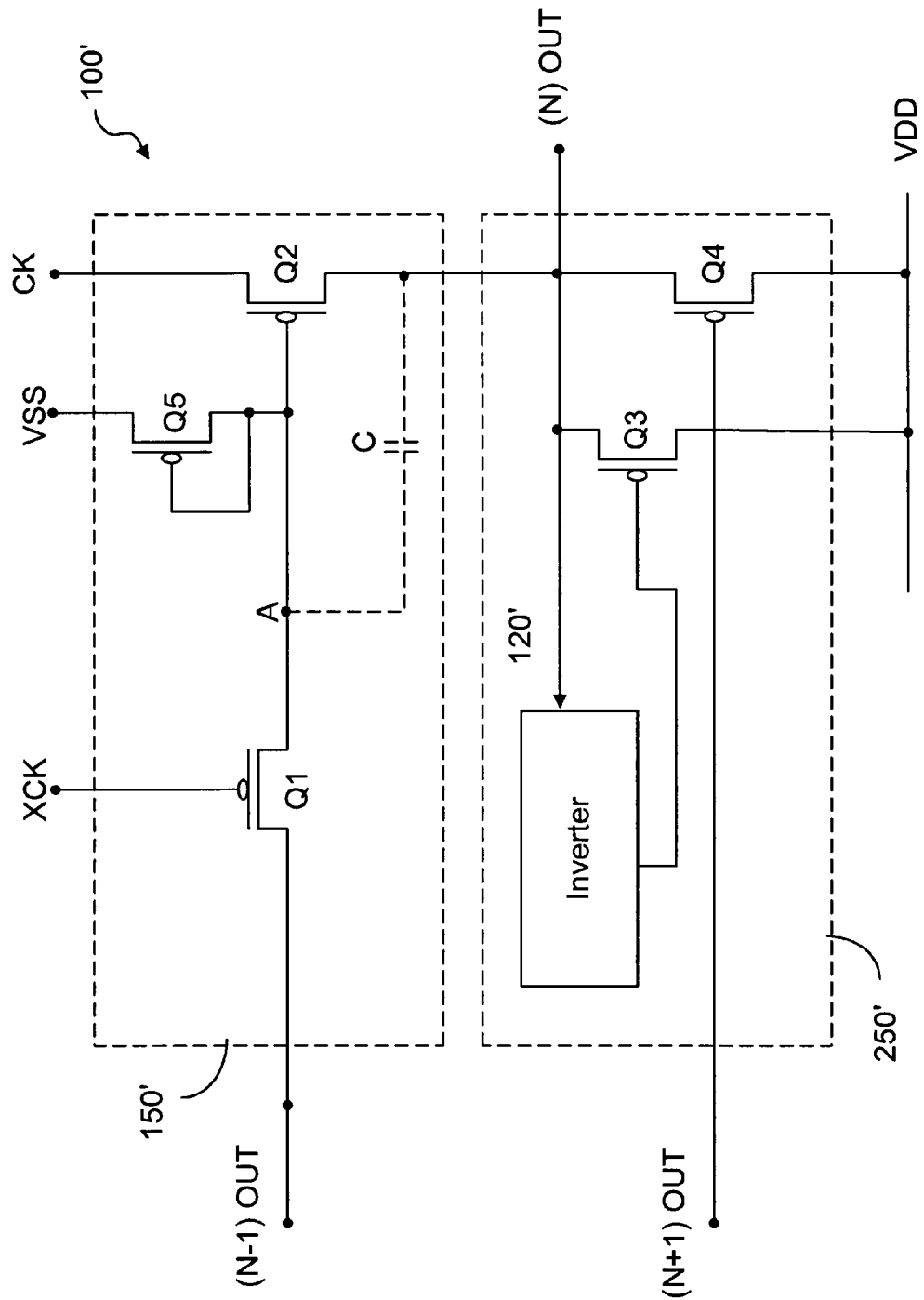
FIG. 7 shows a shift register circuit, according to another embodiment of the present invention.

In this disclosure, a shift register circuit is used to show the bootstrap point in the circuit and to illustrate how the voltage level at the bootstrap point is resulted. In the shift register circuit as shown in FIGS. 1, 4 and 7, the bootstrap point is denoted by the letter A, located at the gate of second transistor Q2.

Figure 1:
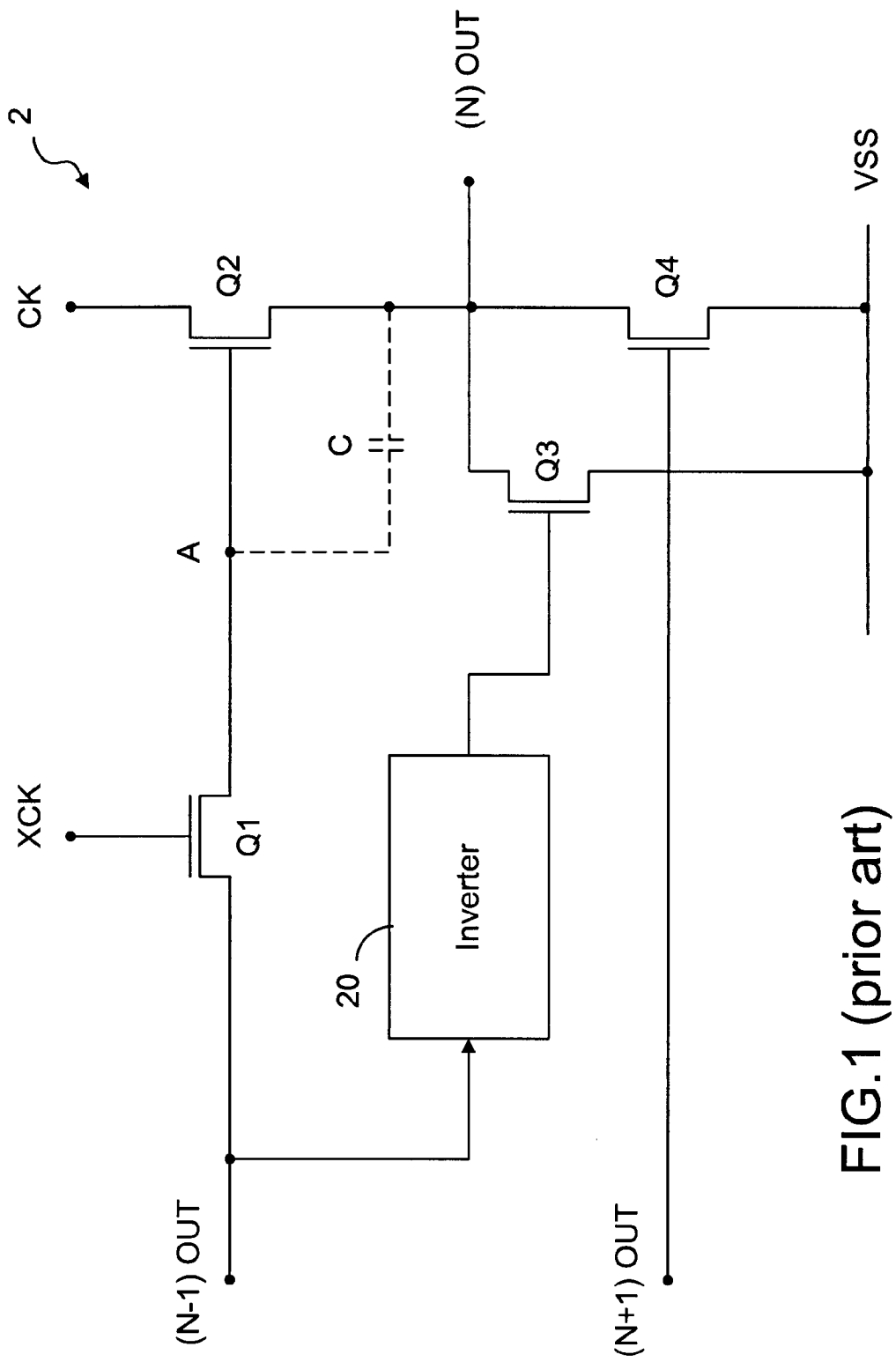
FIG. 1 shows a prior art shift register circuit.

In order to reduce the voltage level at the bootstrap point A of a shift register circuit as shown in FIG. 1, the present invention uses a discharging circuit to discharge the voltage in the time period t2. The shift register circuit, according to one embodiment of the present invention, is shown in FIG. 4. As shown in FIG. 4, the SR circuit 100 comprises four transistors Q1-Q4 and an inverter 120. The first transistor Q1 has a gate coupled to the inverted clock signal XCK and a first source/drain coupled to a signal output (N−1) from a previous-stage shift-register unit. The inverter 120 has an input terminal coupled to the first source/drain of the first transistor Q1. The second transistor Q2 has a gate coupled to a second source/drain of the first transistor Q1; a first source/drain coupled to the clock signal CK and a second source/drain coupled to an output terminal N. The third transistor Q3 has a gate coupled to a first output terminal of the inverter 120; a first source/drain coupled to the output terminal N and a second source/drain coupled to the source voltage VSS. The fourth transistor Q4 has a gate coupled to a signal output N+1 from a next-stage shift-register unit; a first source/drain coupled to the output terminal N and a second source/drain coupled to the source voltage VSS. In the SR circuit as shown in FIG. 4, the bootstrap point A and the second source/drain of the second transistor Q2 is capacitively coupled as indicated by the capacitor C. A discharging circuit is coupled to the bootstrap point A. The discharging circuit can be made of a transistor Q5, for example. The discharging circuit can also be made of two or more transistors or diodes. The first source/drain of the fifth transistor Q5 is connected to the drain voltage VDD and the second source/drain of the fifth transistor Q5 is connected to the gate of the second transistor Q2. The gate of the fifth transistor Q5 is connected to its second source/drain. As such, when the voltage level at the bootstrap point A is higher than the threshold voltage of the fifth transistor Q5, the fifth transistor Q5 is turned on. After discharging for a short time, the voltage level at the bootstrap point A is reduced to Vb2:

$$Vb2 = (VDD - VSS) + n \times Vth$$

where n is the number of diodes or transistors connected in series between the drain voltage VDD and the bootstrap point A. In FIG. 4, the number of diodes or transistors is 1.

The shift register circuit 100, as shown in FIG. 4, can be divided into two circuit sections 150 and 250. Each of the sections can have many different embodiments. The bootstrap circuit section 150 is generally represented by FIG. 9 and has variations as shown in FIGS. 10a to 10e, for example. The base circuit section 250 can have variations as shown in FIGS. 12a and 12b.

Figure 5:
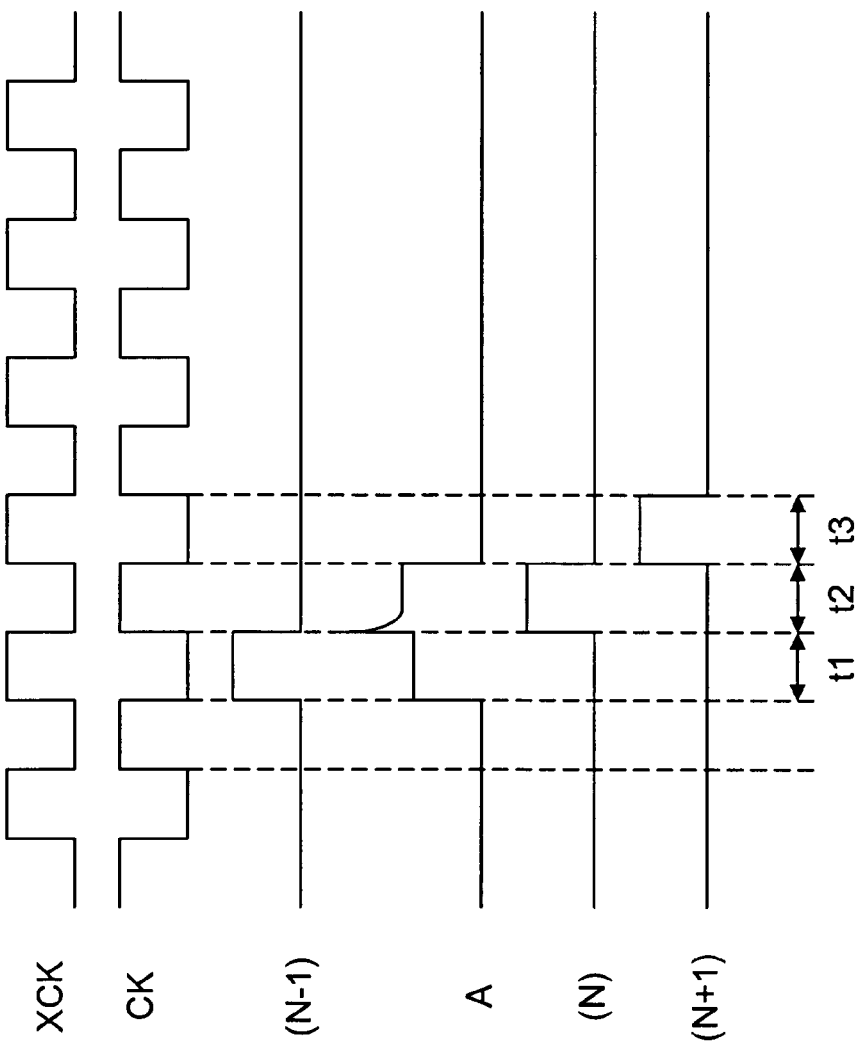
FIG. 5 shows a timing chart of the shift register circuit of FIG. 4.

FIG. 5 shows a timing chart for the shift register circuit as shown in FIG. 4. FIG. 5 shows the voltage levels at the bootstrap point A at various time periods. The operation of the shift register circuit as shown in FIG. 4 is similar to that of the shift register circuit as shown in FIG. 1, except for the discharge during the time period t2.

When the inverted clock signal XCK is at a high voltage level, the first transistor Q1 is turned on. The previous-stage shift-register unit (N−1) outputs a high voltage level signal through the first transistor Q1 to turn on the second transistor Q2. As a result, the output terminal (N) outputs a clock signal to the next-stage shift-register unit (N+1). In addition, the fourth transistor Q4 is switched on by the output signal of the next-stage shift-register unit (N+1). When the fourth transistor Q4 is turned on, the output terminal (N) outputs a low voltage level signal.

When the output terminal (N−1) of the previous-stage shift-register unit outputs a low voltage level signal to the inverter 120, the inverter 120 outputs a high voltage level signal to the third transistor Q3. Thus, the output terminal (N) is held at a low voltage level.

When the first transistor Q1 is turned on during the time period t1, the voltage level of the bootstrap point A and the output signal N are almost equal with a difference of the transistor threshold voltage Vth. When the inverted clock signal XCK is at a low voltage level, the bootstrap point A is in a floating state. According to the feed-though voltage drop theory, the voltage difference between the gate and the first source/drain of the second transistor Q2 is held steady. When the clock signal CK is at a high voltage level at the start of the time period t2, the bootstrap point A is at a higher voltage level. As soon as the voltage level at the bootstrap point A is higher than the threshold voltage of the fifth transistor Q5 as compared to VDD, the voltage is discharged to Vb2. During the time period t3, the output of the next stage shift-register unit (N+1) is high, and the voltage at the bootstrap point A is discharged to a low level.

It should be noted that, the transistors Q1-Q5 are NMOS transistors. In an NMOS shift register circuit, the drain voltage VDD is at a high voltage level and the source voltage VSS is at a low voltage level.

According to another embodiment of the present invention, the transistors Q1-Q5 are PMOS transistors and the inverter is connected differently. In a PMOS shift register circuit, the drain voltage VSS is at a low voltage level and the source voltage VDD is at a high voltage level. As shown in FIG. 7, the input of the inverter 120' is connected to the output N of the shift register circuit 100' and the output of the inverter 120' is connected to the gate of the third transistor Q3.

The shift register circuit 100', as shown in FIG. 7, can be divided into two circuit sections 150' and 250'. Each of the sections can have many different embodiments. The bootstrap circuit section 150' has variations as shown in FIGS. 11a to 11e, for example.

It should be noted that the various NMOS bootstrap circuit sections 150 can be used with the various NMOS base circuit sections 250 in different combinations. Furthermore, some of the NMOS bootstrap sections 150 can also be used in a PMOS shift register circuit for reducing the voltage stress at the bootstrap point A. The embodiment as shown in 10e is an example. Likewise, the PMOS bootstrap circuit sections 150' can also be used in an NMOS shift register circuit.

Figure 8:
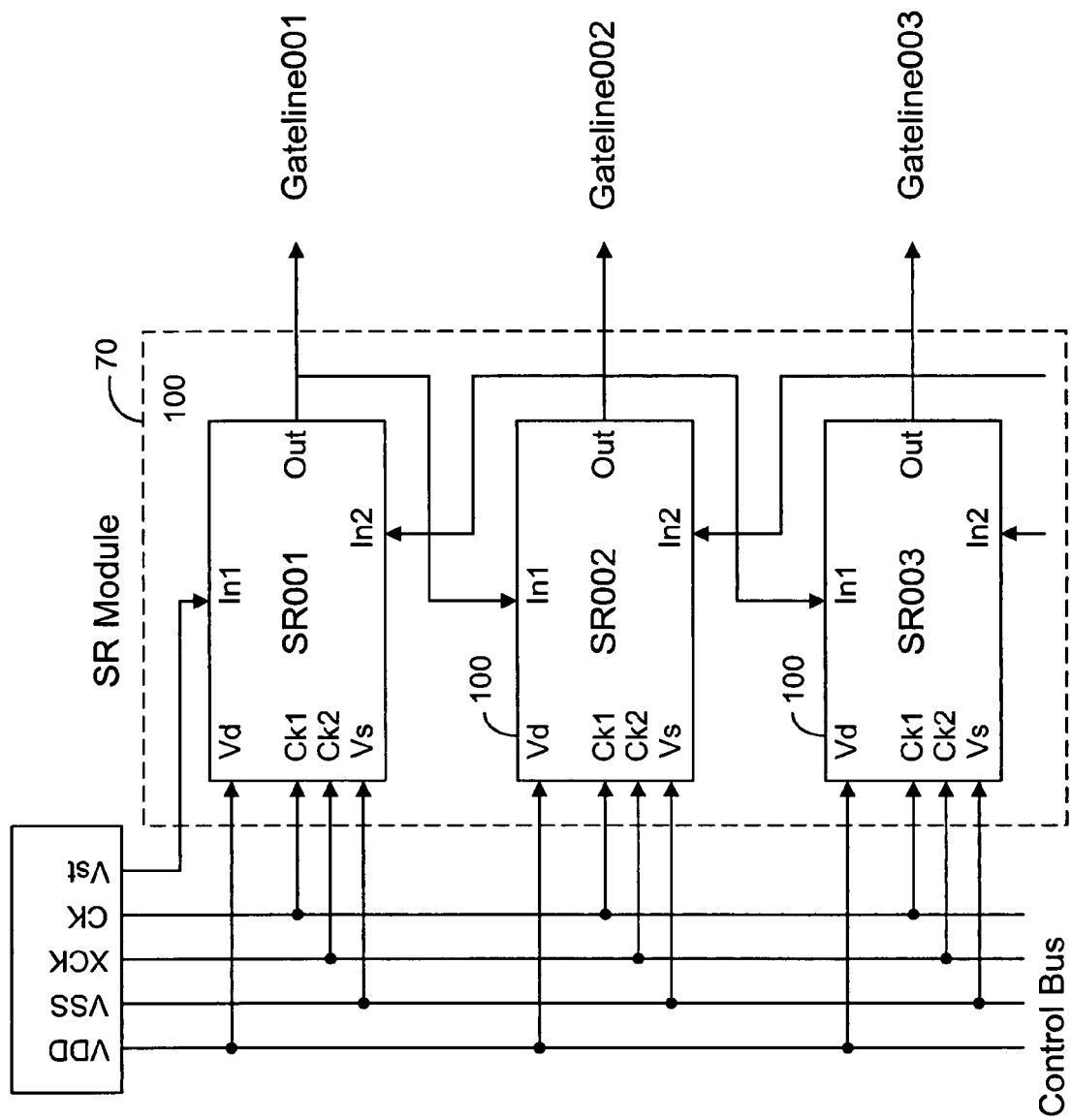
FIG. 8 shows a shift register module having a plurality of shift register units connected in a cascade manner, wherein the outputs of the shift register units are connected to a plurality of gate lines of a display panel.

The shift register circuit 100 or 100' of the present invention can be used as a shift register unit in a shift register module for driving a display panel, for example. As shown in FIG. 8, the shift register module 70 comprises a plurality of shift register units 100 connected in a cascade fashion, with the output of one stage coupled to the input In1 of the next stage and input In2 of the previous stage. Each of the shift register units 100 has a first clock signal input Ck1 coupled to the clock signal CK; a second clock signal input Ck2 coupled to inverted clock signal XCK; a source voltage input Vs coupled to VSS and a drain voltage input Vd coupled to VDD via a control bus. The input of the first shifter register unit is coupled to a start pulse signal Vst. The shift register module 70 can be used to drive a plurality of gate lines of a display panel, for example.

As described, the present invention provides a shift register circuit which comprises four transistors Q1-Q4 and an inverter. Each transistor has a gate, a first source/drain terminal and a second source/drain terminal. A discharging circuit is coupled to the bootstrap point A between the second source/drain of the first transistor Q1 and the gate of the second transistor Q2. The discharging circuit can be made of one transistor Q5 or more transistors connected in series. The first source/drain of the transistor Q5 is connected to a reference voltage such as VDD. In the discharging circuit, the gate of the transistor Q5 is connected to its second source/drain so that when the voltage level at the bootstrap point A exceeds the threshold voltage of the transistor Q5 as compared to the reference voltage VDD, the voltage level at point A is reduced through discharging via Q5 which is now turned on. The output of the inverter is coupled to the gate of the third transistor Q3. The transistors Q1-Q5 can be NMOS transistors or PMOS transistors. In an NMOS shift register circuit, the input of the inverter is coupled to the first source/drain of the first transistor Q1. In a PMOS shift register circuit, the input of the inverter is coupled to the first source/drain of the third transistor Q3.

The present invention also provides a shift register module which comprises a plurality of shift register units coupled in a cascade fashion such that the output of one shift register unit is coupled to the first input of the next shift register unit and to the second input of the previous stage. The shift register module also has a start pulse input coupled to the input of the first shift register unit in the module. Each of the shift register units has a first clock signal input, a second clock signal input, a first voltage input and a second voltage input, wherein the first clock signal input and the second clock signal input are adapted for receiving complementary clock signals.

Although shift register circuits have been used to illustrate the method and device for reducing the bootstrap point in an electronic circuit, it should be noted that the present invention is applicable to any electronic circuit that has a similar bootstrap point. For example, the present invention is applicable in a bootstrap circuit section as shown in FIG. 9.

In the bootstrap circuit section as shown in FIG. 9, a first transistor Q1 is used as a switch 170 to control the states of a second transistor Q2. When the voltage level at the CONTR terminal is high, Q1 is conducting in order to provide a bias voltage to the gate of Q2 based on the voltage level at the INPUT terminal. When the voltage level at the CONTR terminal is low, Q1 is off. A charge is trapped between Q1 and the gate of Q2 if the voltage level at the OUTPUT terminal is high. If the voltage level at the bootstrap point A is high relative to the voltage level at the INPUT terminal, the source-drain voltage across Q1 could damage Q1 if the charge is trapped for a long period of time. In order to reduce the voltage stress imposed on Q1, a discharging module or circuit 160 is coupled to point A to reduce the voltage level at point A according to the reference voltage.

The bootstrap circuit section 150, as shown in FIG. 9, can be used in a NMOS shift register circuit, such as that shown in FIG. 4. In that case, the CONTR input to the gate of Q1 can be XCK and the reference voltage to the discharging circuit 160 can be VDD, as shown in FIG. 10a. Furthermore, the discharging circuit 160 comprises a transistor Q5, wherein the first drain/source terminal of Q5 is coupled to VDD while the gate and the second drain/source terminal is coupled to the bootstrap point A.

In a different embodiment of the present invention, the gate of Q1 of the bootstrap circuit section 150 is coupled to the INPUT terminal, as shown in FIG. 10b.

Figure 10C:
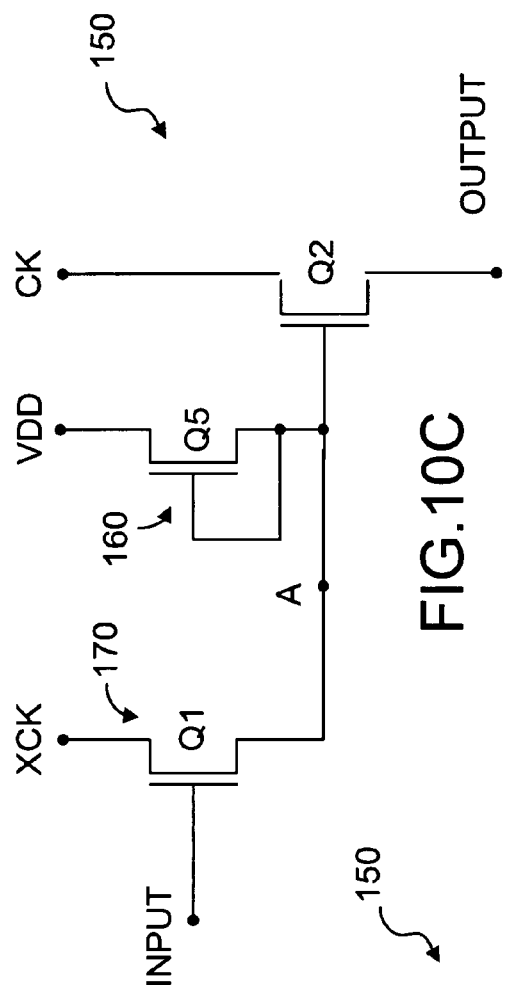
FIG. 10c shows a bootstrap circuit section, according to another embodiment of the present invention.

In another embodiment of the present invention, the switch 170 is arranged differently. As shown in FIG. 10c, the gate of Q1 is coupled to the INPUT terminal. One of the drain/source terminals of Q1 is coupled to XCK and the other drain/source terminal is coupled to the bootstrap point A.

Figure 10D:
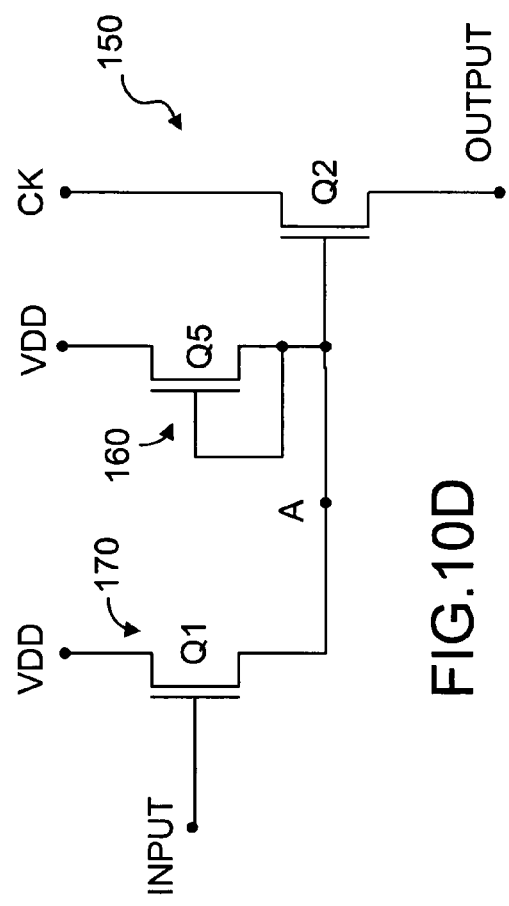
FIG. 10d shows a bootstrap circuit section, according to yet another embodiment of the present invention.

In the embodiment as shown in FIG. 10d, one of the drain/source terminals of Q1 is coupled to VDD, instead of XCK.

Figure 10E:
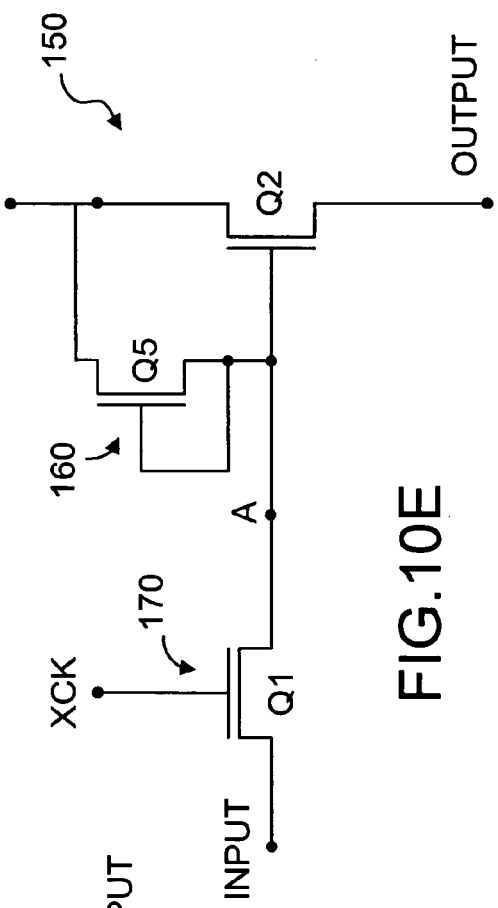
FIG. 10e shows a bootstrap circuit section, according to another different embodiment of the present invention.

In the embodiment as shown in FIG. 10e, the first drain/source terminal of Q5 is coupled to CK. The NMOS embodiment can be used in a PMOS shift register circuit to reduce the voltage stress at the bootstrap point A.

Figure 11A:
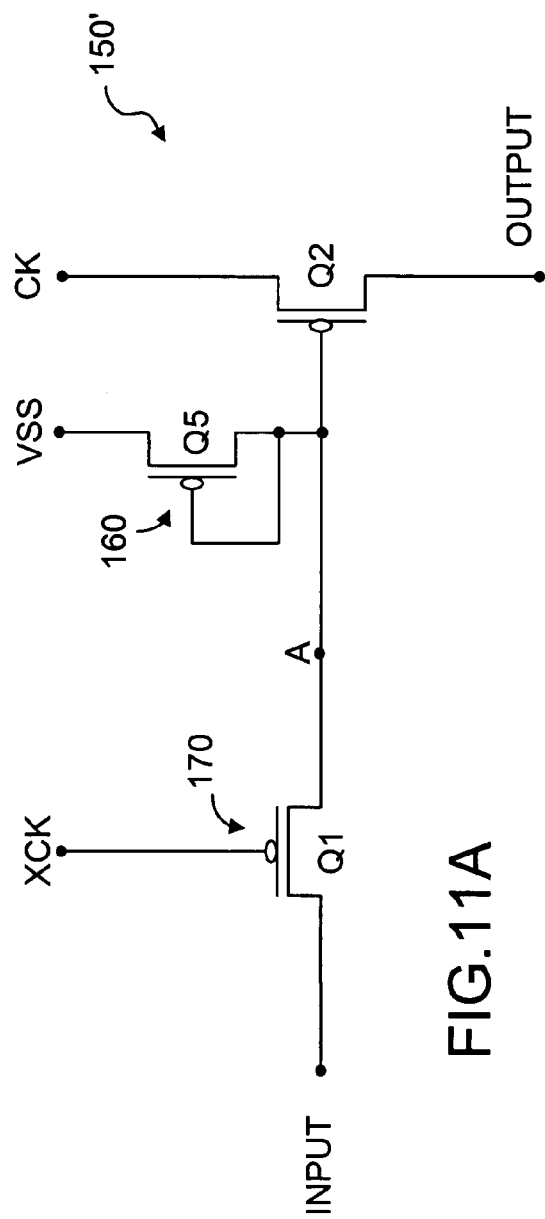
FIG. 11a shows a bootstrap circuit section for use in a shift register circuit of FIG. 7.

The bootstrap circuit section 150, as shown in FIG. 9, can be used in a PMOS shift register circuit, such as that shown in FIG. 7. In that case, the transistors Q1, Q2 and Q5 are also PMOS transistors. In the embodiment as shown in FIG. 11a, the CONTR input to the gate of Q1 is XCK and the reference voltage to the discharging circuit 160 is VSS. In the discharging circuit 160, the first drain/source terminal of Q5 is coupled to VSS while the gate and the second drain/source terminal is coupled to the bootstrap point A.

Figure 11B:
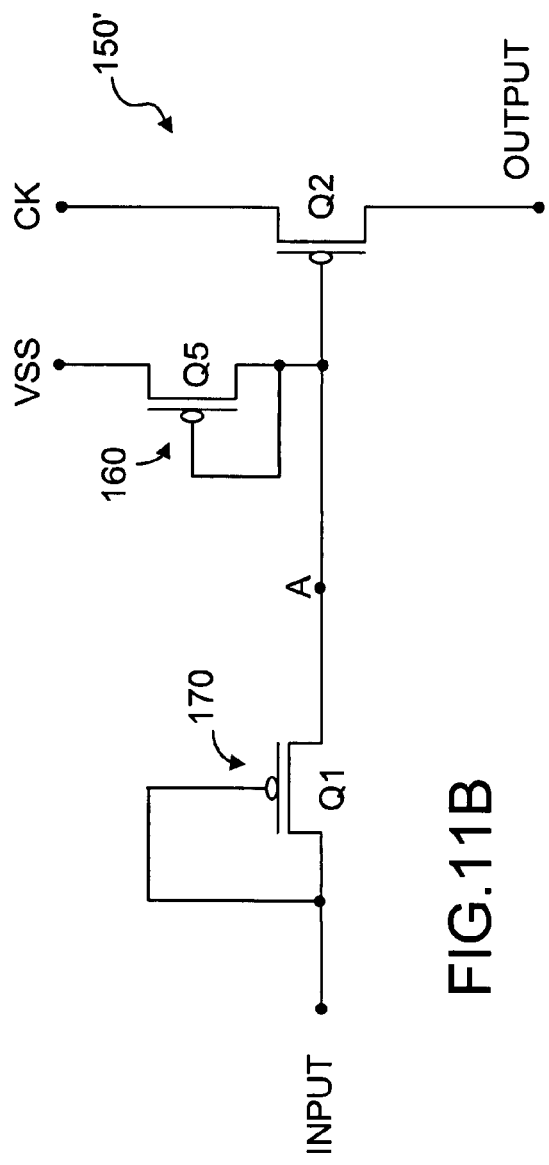
FIG. 11b shows a bootstrap circuit section, according to a different embodiment of the present invention.

In a different embodiment of the present invention, the gate of Q1 of the bootstrap circuit section 150' is coupled to the INPUT terminal, as shown in FIG. 11b.

Figure 11C:
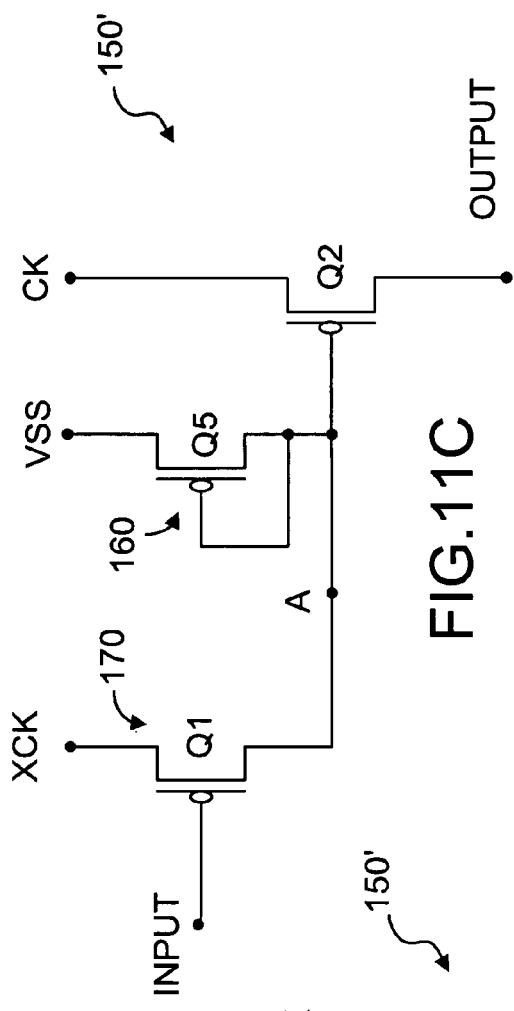
FIG. 11c shows a bootstrap circuit section, according to another embodiment of the present invention.

In another embodiment of the present invention, the switch 170 is arranged differently. As shown in FIG. 11c, the gate of Q1 is coupled to the INPUT terminal. One of the drain/source terminals of Q1 is coupled to XCK and the other drain/source terminal is coupled to the bootstrap point A.

Figure 11D:
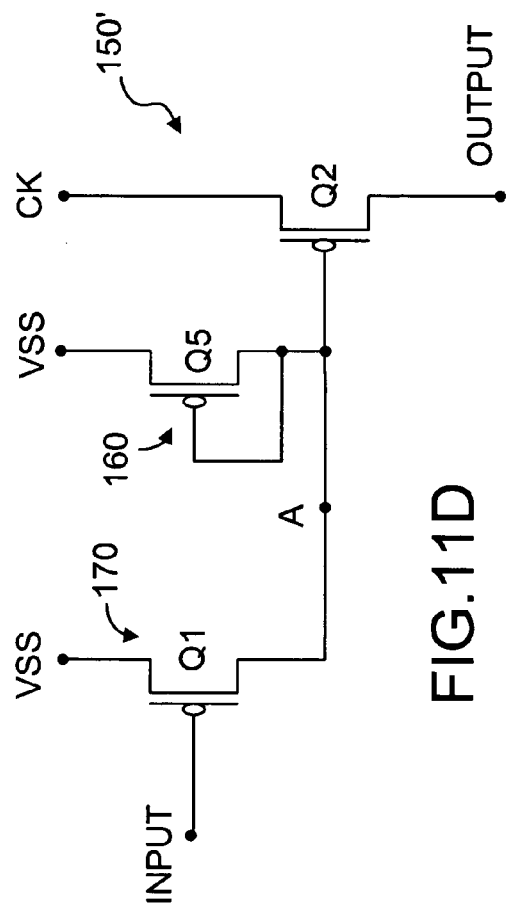
FIG. 11d shows a bootstrap circuit section, according to yet another embodiment of the present invention.

In the embodiment as shown in FIG. 11d, one of the drain/source terminals of Q1 is coupled to VSS, instead of XCK.

Figure 11E:
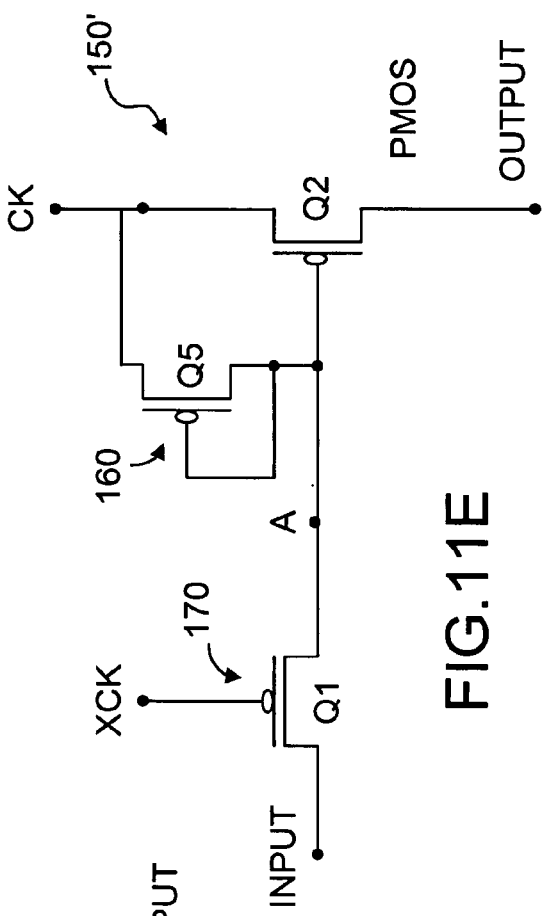
FIG. 11e shows a bootstrap circuit section, according to another different embodiment of the present invention.

In the embodiment as shown in FIG. 11e, the first drain/source terminal of Q5 is coupled to CK.

Figure 12C:
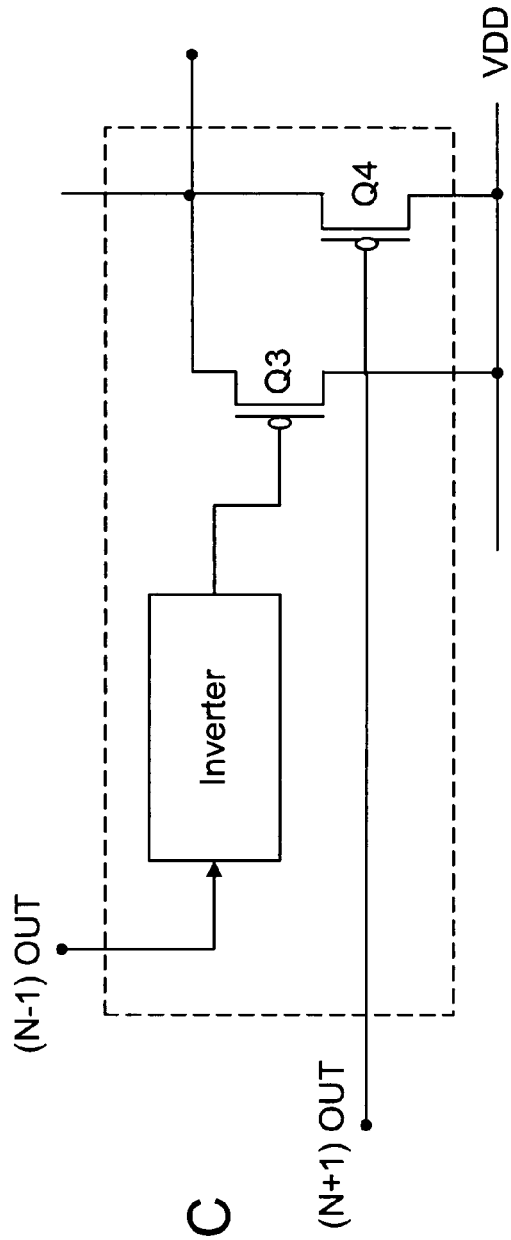
FIG. 12c shows a variation in part of a PMOS shift register circuit, according to one embodiment of the present invention.
Figure 12D:
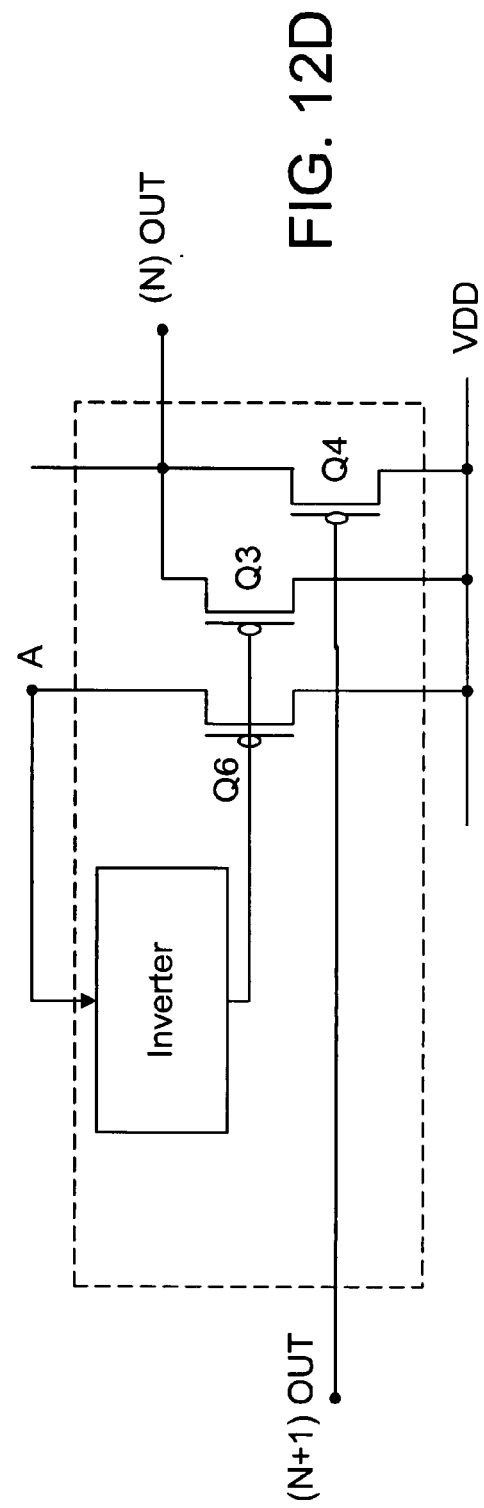
FIG. 12d shows a variation in part of a PMOS shift register circuit, according to another embodiment of the present invention.

Furthermore, the base circuit section 250 and 250' as shown in FIGS. 4 and 7 can also have various embodiment as shown in FIGS. 12a-12d. FIGS. 12a and 12b are variations from the NMOS base circuit section 250 of FIG. 4, with an additional transistor Q6 used in FIG. 12b. FIGS. 12c and 12d are variations from the PMOS base circuit section 250' of FIG. 4, with an additional transistor Q6 used in FIG. 12d. These different embodiments can be used with some of the bootstrap circuit sections 150 and 150' in different combinations.

In sum, the present invention provides a method and device for reducing the voltage stress at a bootstrap point in a bootstrap circuit section which is usually a part of an electronic circuit. In the bootstrap circuit section, a switch is used to control the state of the transistor (output transistor) in an output circuit block. In particular, the switch is coupled to the gate of the output transistor for providing a bias voltage to the gate to cause the output transistor to conduct. The switch may comprise another transistor (switching transistor) with one of its drain/source terminals coupled to the gate of the transistor in the output circuit block. The other drain/source terminal and the gate of the switching transistor can be coupled to a clock signal, a control voltage or an input signal to turn itself on or off. When the switching transistor is off or non-conducting, the voltage differential across the source and drain terminals of the switching transistor may be quite high. In order to reduce this voltage differential, a discharging circuit is used to reduce the voltage level at the bootstrap point. The discharging circuit may comprise a transistor (discharging transistor) which is caused to conduct when the switch transistor is non-conducting Thus, one of the source/drain terminals of the discharging transistor is coupled to a reference voltage while the gate and the other source/drain terminal of the discharging transistor is coupled to the bootstrap point.

The various embodiments of the bootstrap circuit section can be used in an NMOS electronic circuit or a PMOS electronic circuit. For example, the various embodiments of the bootstrap circuit section can be used in a PMOS shift register circuit or an NMOS shift register circuit.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. A method for use in a circuit section of an electronic circuit, comprising:

coupling a discharging element to the circuit section at a coupling point in the circuit section, wherein the circuit section is operable in a first time period and a second time period following the first time period, and the coupling point has a first voltage level in the first time period and a second voltage level in the second time period; and reducing the second voltage level at the coupling point in the second time period through the discharging element, wherein the circuit section comprises:

an input element operable in a connecting state and a non-connecting state, and an output element having an output terminal and a gate coupled to the input element at the coupling point in the circuit section, wherein when the circuit section is operated in the first time period, the input element is operated in the connecting state for providing a bias voltage level to the gate of the output element through the coupling point, wherein the bias voltage level is substantially equal to the first voltage level, and when the circuit section is operated in the second time period, the input element is operated in the non-connecting state, the voltage level at the coupling point increases from the first voltage level to the second voltage level partly due to an increased voltage level at the output terminal of the output element.

2. The method of claim 1, wherein the input element comprises a first transistor and when the input element is operated in the connecting state, the first transistor is operated in a conducting state, and when the input element is operated in the non-connecting state, the first transistor is operated in a non-conducting state, and wherein the output element comprises a second transistor having a source/drain terminal coupling to the output terminal.

3. The method of claim 2, wherein the discharging element comprises a third transistor having a first source/drain terminal coupled to the coupling point;

a gate terminal coupled to the coupling point and a second source/drain terminal coupling a reference voltage level substantially equal to the first voltage level so as to maintain the first voltage level in the first time period and to reduce the second voltage level in the second time period.

4. The method of claim 2, wherein the first transistor comprises:

a first drain/source terminal coupled to the coupling point;

a second drain/source terminal coupled to an input to receive an input voltage substantially equal to the first voltage level in the first time period; and a gate coupling to a clock signal for causing the first transistor to operate in the conducting state in the first time period.

5. The method of claim 2, wherein the first transistor comprises:

a first drain/source terminal coupled to the coupling point;

a second drain/source terminal and a gate both coupled to an input to receive an input voltage substantially equal to the first voltage level in the first time period.

6. The method of claim 2, wherein the first transistor comprises:
- a first drain/source terminal coupled to the coupling point;
- a second drain/source terminal coupled to a clock signal substantially equal to the first voltage level in the first time period and
- a gate coupled to an input to receive an input voltage for causing the first transistor to operate in the conducting state in the first time period.

7. An electronic circuit comprising:
- an input element operable in a connecting state and in a non-connecting state;
- an output element having an output terminal, and a gate coupled to the input element at a coupling point; and
- a discharging element coupled to the coupling point, wherein the electronic circuit is operable in a first time period and a second time period following the first time period, and wherein,
- in the first time period, the input element is operated in the connecting state for providing a first voltage level to the gate of the output element through the coupling point, and
- in the second time period, the input element is operated in the non-connecting state, and a voltage level at the coupling point increases from the first voltage level to a second voltage level partly due to an increased voltage level at the output terminal of the output element, and wherein
- the discharging element is adapted to reduce the second voltage level at the coupling point in the second time period.

8. The electronic circuit of claim 7, wherein the input element comprises a first transistor and
- when the input element is operated in the connecting state, the first transistor is operated in a conducting state, and
- when the input element is operated in the non-connecting state, the first transistor is operated in a non-conducting state, and wherein the output element comprises a second transistor having a source/drain terminal coupling to the output terminal.

9. The electronic circuit of claim 8, wherein the discharging element comprises a third transistor having
- a first source/drain terminal coupled to the coupling point;
- a gate terminal coupled to the coupling point and
- a second source/drain terminal coupling a reference voltage level substantially equal to the first voltage level so as to maintain the first voltage level in the first time period and to reduce the second voltage level in the second time period.

10. The electronic circuit of claim 8, wherein the first transistor comprises:
- a first drain/source terminal coupled to the coupling point;
- a second drain/source terminal coupled to an input terminal to receive an input voltage substantially equal to the first voltage level in the first time period; and
- a gate coupling to a clock signal for causing the first transistor to operate in the conducting state in the first time period.

11. The electronic circuit of claim 8, wherein the first transistor comprises:
- a first drain/source terminal coupled to the coupling point;
- a second drain/source terminal and a gate both coupled to an input to receive an input voltage substantially equal to the first voltage level in the first time period.

12. The electronic circuit of claim 8, wherein the first transistor comprises:
- a first drain/source terminal coupled to the coupling point;
- a second drain/source terminal coupled to a clock signal substantially equal to the first voltage level in the first time period and
- a gate coupled to an input to receive an input voltage for causing the first transistor to operate in the conducting state in the first time period.

13. The electronic circuit of claim 10, wherein the second transistor further comprises a second source/drain terminal coupled to a second clock signal complementary to the clock signal.

14. The electronic circuit of claim 13, further comprising:
- an inverter having an output end;
- a third transistor having a gate, a first source/drain and a second source/drain; and
- a fourth transistor having a gate, a first source/drain and a second source/drain, wherein the discharging element comprises a fifth transistor having
- a first source/drain terminal coupled to the coupling point;
- a gate terminal coupled to the coupling point and
- a second source/drain terminal coupling a first reference voltage level substantially equal to the first voltage level so as to maintain the first voltage level in the first time period and to reduce the second voltage level in the second time period, and wherein
- the gate of the third transistor is coupled to the output end of the inverter; the first source/drain of the third transistor is coupled to the output terminal; and the second source/drain of the third transistor is coupled to a second reference voltage level, and
- the gate of the fourth transistor is coupled to a second input terminal, the first source/drain of the fourth transistor is coupled to the output terminal and the second source/drain of the fourth transistor is coupled to the second reference voltage level.

15. The electronic circuit of claim 14, wherein the first to fifth transistors are NMOS transistors and the first source/drain of the first transistor is coupled to an input end of the inverter, and the second reference voltage level is lower than the first reference voltage level.

16. The electronic circuit of claim 14, wherein the first to fifth transistors are PMOS transistors and the first source/drain of the third transistor is coupled to an input end of the inverter, and the second reference voltage level is higher than the first re voltage level.

17. A shift register module, comprising:
- a first clock signal input;
- a second clock signal input;
- a first voltage input;
- a second voltage input;
- a start pulse input;
- a plurality of other shift register units arranged in a plurality of stages, each of said plurality of register units comprising:
  - a first input terminal;
  - a second input terminal;
  - an output terminal;
  - an inverter having an output;
  - a discharging circuit having a first end and a second end;
  - a first transistor having a gate, a first source/drain and a second source/drain;
  - a second transistor having a gate, a first source/drain and a second source/drain;
  - a third transistor having a gate, a first source/drain and a second source/drain; and a fourth transistor having a gate, a first source/drain and a second source/drain, wherein the gate of the first transistor is coupled to the first clock signal input; the first drain/source of the first transistor is coupled to the first input terminal, and the second drain/source of the first transistor is coupled to the gate of the second transistor;

the first source/drain of the second transistor is coupled to the second clock signal input, and the second source/drain of the second transistor is coupled to the output terminal;

the gate of the third transistor is coupled to the output of the inverter; the first source/drain of the third transistor is coupled to the output terminal; and the second source/drain of the third transistor is coupled to the first voltage input;

the gate of the fourth transistor is coupled to the second input terminal, the first source/drain of the fourth transistor is coupled to the output terminal, and the second source/drain of the fourth transistor is coupled to the first voltage input; and the first end of the discharging circuit is coupled to a second voltage input, and the second end of the discharging circuit is coupled to the gate of the second transistor;

and wherein the shift registers are connected in a cascade manner such that the first input terminal of one shift register unit is coupled to the output terminal of the shift register in a previous stage;

the second input terminal of said one shift register unit is coupled to the output terminal of the shift register in a next stage;

the first input terminal of the shift register in a first stage is coupled to the start pulse input;

the first clock signal input and the second signal input are adapted for receiving complementary clock signals; and the first voltage input and the second voltage input are adapted for receiving, respectively, a first voltage level and a different second voltage level.

18. The shift register module of claim 17, wherein the discharging circuit comprises a transistor having a gate, a first source/drain and second source/drain, wherein the first source/drain is coupled to the first end of the discharging circuit, and the gate and the second source/drain are coupled to the second end of the discharging circuit.

19. The shift register module of claim 17, wherein the first to fourth transistors are NMOS transistors and the first source/drain of the first transistor is coupled to an input of the inverter, and the first voltage level is lower than the second voltage level.

20. The shift register module of claim 17, wherein the first to fourth transistors are PMOS transistors and the first source/drain of the third transistor is coupled to an input of the inverter, and the first voltage level is higher than the second voltage level.

* * * * *